US011416081B1

(12) United States Patent
Sinivaara (10) Patent No.: US 11,416,081 B1
(45) Date of Patent: Aug. 16, 2022

(54) INTEGRAL 3D STRUCTURE FOR CREATING UI, RELATED DEVICE AND METHODS OF MANUFACTURE AND USE

(71) Applicant: TactoTek Oy, Oulunsalo (FI)

(72) Inventor: Hasse Sinivaara, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 17/468,938

(22) Filed: Sep. 8, 2021

(51) Int. Cl.
*G06F 3/01* (2006.01)
*G06F 3/04847* (2022.01)
*G06F 3/04883* (2022.01)

(52) U.S. Cl.
CPC .......... *G06F 3/017* (2013.01); *G06F 3/04847* (2013.01); *G06F 3/04883* (2013.01)

(58) Field of Classification Search
CPC ... G06F 3/017; G06F 3/04847; G06F 3/04883
See application file for complete search history.

(56) References Cited

U.S. PATENT DOCUMENTS

| 5,410,290 | A | * | 4/1995 | Cho | H01H 61/0107 60/527 |
|---|---|---|---|---|---|
| 6,027,958 | A | * | 2/2000 | Vu | H01L 21/568 257/679 |
| 7,382,357 | B2 | * | 6/2008 | Panotopoulos | G06F 3/0202 345/168 |
| 7,576,991 | B2 | * | 8/2009 | Naritomi | H05K 3/284 361/748 |
| 8,377,347 | B2 | * | 2/2013 | Sostmann | B60R 13/02 264/21 |
| 8,506,826 | B2 | * | 8/2013 | Rogers | B81C 1/00714 216/2 |
| 9,185,831 | B2 | * | 11/2015 | Moon | H05K 5/06 |
| 10,070,542 | B2 | * | 9/2018 | Ito | H05K 3/284 |
| 11,021,099 | B2 | * | 6/2021 | Peng | B60K 35/00 |
| 2005/0000726 | A1 | * | 1/2005 | Kimata | H05K 3/284 29/841 |
| 2005/0242607 | A1 | * | 11/2005 | Neumann | B60Q 3/64 296/39.1 |
| 2009/0002328 | A1 | * | 1/2009 | Ullrich | G09B 21/004 345/173 |
| 2009/0301852 | A1 | * | 12/2009 | Keist | B60K 37/06 200/341 |
| 2010/0126834 | A1 | * | 5/2010 | Ikehashi | G11C 23/00 200/181 |
| 2010/0250071 | A1 | * | 9/2010 | Pala | B60K 35/00 701/48 |

(Continued)

*Primary Examiner* — Grant Sitta
(74) *Attorney, Agent, or Firm* — Robert P. Michal, Esq.; Carter, DeLuca & Farrell LLP (57) ABSTRACT

An integrated functional multilayer structure includes a flexible, 3D-formable substrate film having a first surface facing towards an environment of the structure and a user therein, and an opposite second surface facing towards the internals of the structure, wherein the first and second surfaces and remaining material of the substrate film in between locally define a three-dimensional protrusion extending from a plane of surrounding substrate film material and formed from locally stretched and shaped material of the substrate film, side walls perceptible by touch; circuitry provided upon the substrate film includes a number of conductive traces, electrodes and/or components to detect touch on two or more of the plurality of side walls and at least one fill layer upon the substrate film to at least partially embed the circuitry.

29 Claims, 7 Drawing Sheets

(56) References Cited

U.S. PATENT DOCUMENTS

| | | | |
|---|---|---|---|
| 2011/0048909 A1* | 3/2011 | Clark | H01H 9/181 200/330 |
| 2011/0157906 A1* | 6/2011 | Oeuvrard | B60R 13/02 362/488 |
| 2011/0247926 A1* | 10/2011 | Osborn | H01H 13/85 200/515 |
| 2012/0161795 A1* | 6/2012 | Pfau | H03K 17/962 324/679 |
| 2012/0306757 A1* | 12/2012 | Keist | B29C 45/0053 345/168 |
| 2012/0314348 A1* | 12/2012 | Moncrieff | H05K 5/0243 361/679.01 |
| 2013/0248345 A1* | 9/2013 | Haag | H01H 11/04 200/600 |
| 2014/0054919 A1* | 2/2014 | Oeuvrard | H01H 13/14 296/70 |
| 2014/0225855 A1* | 8/2014 | Aitchison | G06F 3/041 345/173 |
| 2015/0016144 A1* | 1/2015 | Keist | B29C 45/0053 362/611 |
| 2016/0185351 A1* | 6/2016 | Jerger | F16H 61/0204 701/56 |
| 2016/0192474 A1* | 6/2016 | Niskala | H05K 3/284 361/679.55 |
| 2018/0279471 A1* | 9/2018 | Chen | B32B 27/16 |
| 2019/0012032 A1* | 1/2019 | Brandao Salgado | B32B 7/05 |
| 2021/0053499 A1* | 2/2021 | Bogdanov | B60R 7/04 |
| 2021/0122390 A1* | 4/2021 | Rea | E05B 81/77 |
| 2021/0180775 A1* | 6/2021 | Whitehead | H03K 17/962 |
| 2021/0348326 A1* | 11/2021 | Thiel | B32B 27/304 |

* cited by examiner

INTEGRAL 3D STRUCTURE FOR CREATING UI, RELATED DEVICE AND METHODS OF MANUFACTURE AND USE

FIELD OF THE INVENTION

The present invention relates in general to functional, integrated structures incorporating various functional features such as electronic, mechanical or optical elements, or their different combinations. In particular, however not exclusively, the present invention concerns provision of UI (user interface) solutions for electronic devices via such integrated structures.

BACKGROUND

There exists a variety of different stacked assemblies and multilayer structures in the context of different functional ensembles e.g. in the field of electronics and electronic products. The motivation behind the integration of functionalities involving e.g. electronics, mechanical or optical features may be as diverse as the related use contexts. Relatively often size savings, weight savings, cost savings, or just efficient integration of components is sought for when the resulting solution ultimately exhibits a multilayer nature. In turn, the associated use scenarios may relate to product packages or casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

Furthermore, the concept of injection molded structural electronics (IMSE) involves building functional devices and parts therefor in the form of a multilayer structure, which encapsulates electronic functionality as seamlessly as possible. Characteristic to IMSE is also that the electronics is commonly manufactured into a true 3D (non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment. Further layers and elements may be naturally added to the construction.

Many electronic devices require or at least benefit from a user interface that enables users both to control the devices and obtain feedback therefrom or therethrough. As the integration level and general complexity of the electronic devices seems to generally go up while the size may simultaneously decrease, it is not always straightforward to design a related feasible UI without any major downside. Even the more modern UI's such as rotatable controllers, touchscreens and touchpads may easily turn out functionally regrettably limited, counter-intuitive, fragile or at least ergonomically challenging, thereby causing fatigue if not more significant health issues to a user, and occasionally, the UI's may even be deemed causing danger depending on their use context considering e.g., cases where a user should concentrate their gaze on something else than the UI while still tempted or required to apply the UI the use of which requires a considerable amount of visual attention; these situations may easily occur e.g., in traffic. It is indeed quite usual in various UI's to provide an ergonomically awkward flat, touch-sensitive surface which the user typically needs to gaze or look while operating e.g. a hosting smartphone, tablet, multimedia device or various in-vehicle electronics and related functionalities. Provision of input easily becomes a risky and tedious exercise. Another quite possible UI is a rotator handle or knob, an electromechanical knob/button which allows the user to interact by physically turning the knob or pushing (moving) it e.g., in front-rear or left-right directions and push or tap from the top. All these solutions may be prone to failure while further requiring elevated attention from a user to avoid misinput in addition to being quite limited practical control logic-wise.

SUMMARY

The objective of the present invention is to at least alleviate one or more of the drawbacks associated with the known solutions in the context of UI's and associated electronic or at least electrically controllable devices.

The objective is achieved with various embodiments of an integrated, functional multilayer structure and related methods for using or providing the multilayer structure.

According to one aspect, an integrated functional multilayer structure for building a gestural UI (user interface), comprises a flexible, 3D-formable substrate film comprising a first surface for facing towards an environment of the structure and a user therein, and an opposite second surface facing towards the internals of the structure, wherein the first and second surfaces and remaining material of the substrate film in between locally and jointly define a three-dimensional protrusion extending from a plane of surrounding substrate film material and formed from locally stretched and shaped material of the substrate film, said protrusion defining, in the multilayer structure, a continuous multi-sided knob, recess or other shape with a plurality of substantially vertical or canted (relative to the plane), and optionally at least locally curved, side walls perceptible by touch;

circuitry, such as control and/or detection circuitry, provided upon the substrate film (e.g., directly onto the substrate film, or specifically, a surface of the substrate film, and/or (on)to any underneath layer(s), such as a further (substrate) film) and optionally at least partially accommodated by a volume defined by the protrusion shape and the plane, said circuitry comprising a number of conductive traces, electrodes and/or components configured to detect touch on two or more of the plurality of side walls and preferably, a top of the protrusion (i.e., knob top or recess bottom) shape;

and at least one fill layer of preferably thermoplastic fill material arranged, optionally molded such as injection molded or cast, upon the substrate film to at least partially embed the circuitry and optionally at least partially fill the volume.

In various embodiments, at least part of the circuitry is attached or produced on or specifically, to, the second surface of the substrate film. For example, sensing elements such as one or more electrodes, attached conductors (traces) or related driving or control circuitry may be such elements.

A host device may comprise an embodiment of the multilayer structure described or characterized herein. The host device may be or comprise at least one of a console, vehicle console, door, roof panel, multimedia device, computer device, home appliance (e.g., cooking device, cleaning device, cooling device such as a fridge or a freezer, washing machine, dryer, heater, lawnmover, or a lighting device), vehicle, road vehicle (e.g., a car or truck), marine vessel (e.g. a boat or ship), airplane or generally aerial vehicle, personal communications device, or a control device. The multilayer structure may be configured to form at least part of a UI such as a control console or panel of the host device.

The host device may in some embodiments be or comprise e.g., an arm rest. The device may be optionally provided with an object sensor such as an arm or wrist sensor, optionally at least one capacitive, resistive, optical and/or pressure sensor. The device may be configured to change the operational state of the structure based on data provided by the sensor, which may refer to adapting or activating touch sensing responsive to detecting the presence of a user's arm or wrist upon the arm rest, for instance.

According to one more aspect, the structure or device according to any embodiment described or characterized herein may be used in obtaining user input and optionally initiating a control action based on the user input.

In a further aspect, a method of manufacturing an integrated multilayer structure, comprises:

obtaining a substrate film comprising formable, optionally thermoformable, material and further comprising a first surface for facing towards an environment of the structure and a user therein, and an opposite second surface for facing towards the internals of the structure;

providing circuitry upon the substrate film, preferably utilizing printed electronics technology and/or selected mounting technology;

3D-forming the substrate film so that the first and second surfaces and remaining material of the formed substrate film in between locally define a three-dimensional protrusion extending from a plane of surrounding substrate film material, said protrusion defining a multi-sided knob, recess, or other shape in the structure with a plurality of substantially vertical or canted, and optionally at least locally curved, side walls perceptible by touch;

wherein said circuitry, optionally being at least partially accommodated by a volume defined by the protrusion shape and the plane, comprises a number of conductive traces, electrodes and/or components configured upon the substrate film so as to detect touch on two or more of the plurality of side walls and preferably, a top of the protrusion (i.e., knob shape top or recess shape bottom); and arranging at least one fill layer of preferably thermoplastic fill material optionally by injection molding or casting, upon the substrate film to at least partially embed the circuitry and optionally to at least partially fill the aforesaid volume.

The present invention provides different advantages over a great variety of known UI's, naturally depending on each particular embodiment thereof. Accordingly, a three-dimensional easy-to-adopt, easy-to-use, reliable and ergonomically convenient smart surface for UI purposes including user input provision may be cleverly established by 3D-shaping, optionally thermoforming, of a suitable substrate film. The film may be thus translated into a hermetically sealed and monolithic gesture sensitive including touch sensitive 3D-surface (if desired) and supplemented with various electronics and further features and material layers to come up with a preferred UI solution for a concerned use case.

The established shapes may differ between the embodiments, but in various preferred ones, a multi-sided or specifically, a multi-faceted such as four side facets-containing smart surface having e.g., a squircle-shaped top may indeed be locally lifted or lowered by 3D-shaping to create a knob or recess shape that a user may touch (knob/recess) and pinch (knob) with their fingers, and use for control input purposes and optionally also for receiving e.g., tactile or visual feedback or generally output from the multilayer structure itself, or from a hosting or connected device.

By carefully designing the corners between the side walls or facets of the knob or recess, a comprehensive, even a full 360 degree, effortless finger travel or slide may be enabled thereon. The vertical or canted surfaces of the side walls are indeed preferably rounded at the corners to allow smooth transition between them via finger(s) of the user for both ergonomic and intuitive usage. A desired number of intuitive gesture zones or segments can be configured at the facets and/or the top of the protrusion by the utilized sensing circuitry and related, optionally software configurable and e.g. remotely configurable (e.g. user-configurable), detection or generally, operation logic to implement support for the detection of all desired gestures such as easy-to-input simple finger gestures while still also enabling a vast number of more versatile control logic options in e.g. GUI (graphical user interface) applications. Even somewhat complex user interface controls can thus be created with rather simple, easy-to-adopt-and-execute gesture patterns in the physical user interface via the protruding "knob" or descending "recess" shape established in the overall multilayer structure by various embodiments of the present invention.

The multi-sided or -faceted 3D surfaces suggested herein provide extremely versatile while still effortless control logics based on e.g. single or multi finger sliding input and tap input. In some embodiments, the detected input gestures may additionally or alternatively include contactless gesture input, which may involve "drawing" or pointing in the air with one or more fingers within the detection range of the sensing element(s) of the multilayer structure, for example.

In various embodiments, the detected gestures may generally include e.g., parallel sync (two fingers e.g. laterally sliding in the same direction on opposing side walls/facets of the protrusion) and parallel opposite direction. Yet, single finger in any segment or particularly, e.g. thumb on one segment such as side wall/facet while other finger(s) such as index or middle finger on the adjacent or opposite side may be detected, wherein any or all of the detected fingers may be static or sliding, and motion such as a lateral swipe in a certain direction on a certain side wall/facet may be associated with a control action different from otherwise similar swipe in opposite direction or e.g. from a tap action. Also continuous slides involving several adjacent side walls or generally surfaces of the protrusion in sequence may be detected.

Any of these distinguishable input gestures including e.g., various slide and tap logic combinations may be associated, by the control logic stored in the circuitry or in a connected hosting/external device, with a distinctive control action such as a feature selection, activation, deactivation or scrolling action e.g. on a GUI thus potentially involving also a control display of a controlled device or a device connected thereto. The association may be context-dependent or generally, dynamic, as discussed hereinlater. Needless to point out, gesture patterning enabled by various embodiments of the present invention further facilitate e.g. easy and intuitive pinch zoom by detecting at least two moving fingers such as thumb and index finger e.g., on adjacent side walls/facets (etc. moving apart, moving in—how the zoom in/out direction is controlled, this may configured on embodiment basis). In any case, the 3D-shaped protrusion knob or recess allows the user to interact naturally with various gesture combinations. For instance, a simple scroll action could be activated by interfacing a single side wall/facet (e.g. menu (item) travel) by e.g., finger slide on either lateral direction. The opposite parallel side wall/facet could then be a (thumb) tap logic making it e.g., a simple scroll+tap UI logic or "mouse logic". Executing a similar scroll logic with two opposite parallel facets but gestures being in opposite direction could trigger e.g., faster travel option in the menu, or activate a selected such as a segment-by-segment GUI/UI interaction control, for example.

The multilayer structure and specifically e.g., the knob or recess-establishing protrusion provided in it may also integrate and/or neighbor a number of visual aids such as static visuals including e.g., informative graphics such as instructional symbols. Alternatively or additionally, the visual aids may include dynamic visuals such as dynamically controllable lighting, optionally a number of LED's, to provide guidance (e.g., indication of active touch surface such as side wall/facet or top of the structure), feedback (e.g., an indication of a detected gesture by an associated visual response such as activated light(s) or characterizing lighting sequence), or other output such as device or particular feature status information to the user.

Besides providing integral UI feature to a certain host device by integrating an embodiment of the suggested multilayer structure e.g. in a housing of the present invention, for example, various embodiments of the present invention may be harnessed into providing a more general control device to replace e.g., a mouse. The control device could be additionally configured to detect its own rotation along a selected axis such as the vertical axis thereof and further configured to execute a related control action. This control device could be wiredly or wirelessly connected whenever desired to any of a number of target devices to be controlled. Accordingly, an internal power source (disposable battery, rechargeable battery, etc.) or external power source (via a cable that connects to the target device, for example) could be provided to power this kind of a multi-purpose control device.

Various other advantages will become clear to a skilled person based on the following detailed description.

The expression "a number of" may herein refer to any positive integer starting from one (1), such as one, two, or three.

The expression "a plurality of" may refer to any positive integer starting from two (2), respectively.

The terms "first", "second", "third" and "fourth" are herein used to distinguish one el-ement from other element(s), and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also un-recited features. The features recited in various embodiments and e.g. dependent claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example, and not by way of limitation, in the figures of the accompanying drawings.

DETAILED DESCRIPTION OF SOME EMBODIMENTS

Figure 1:
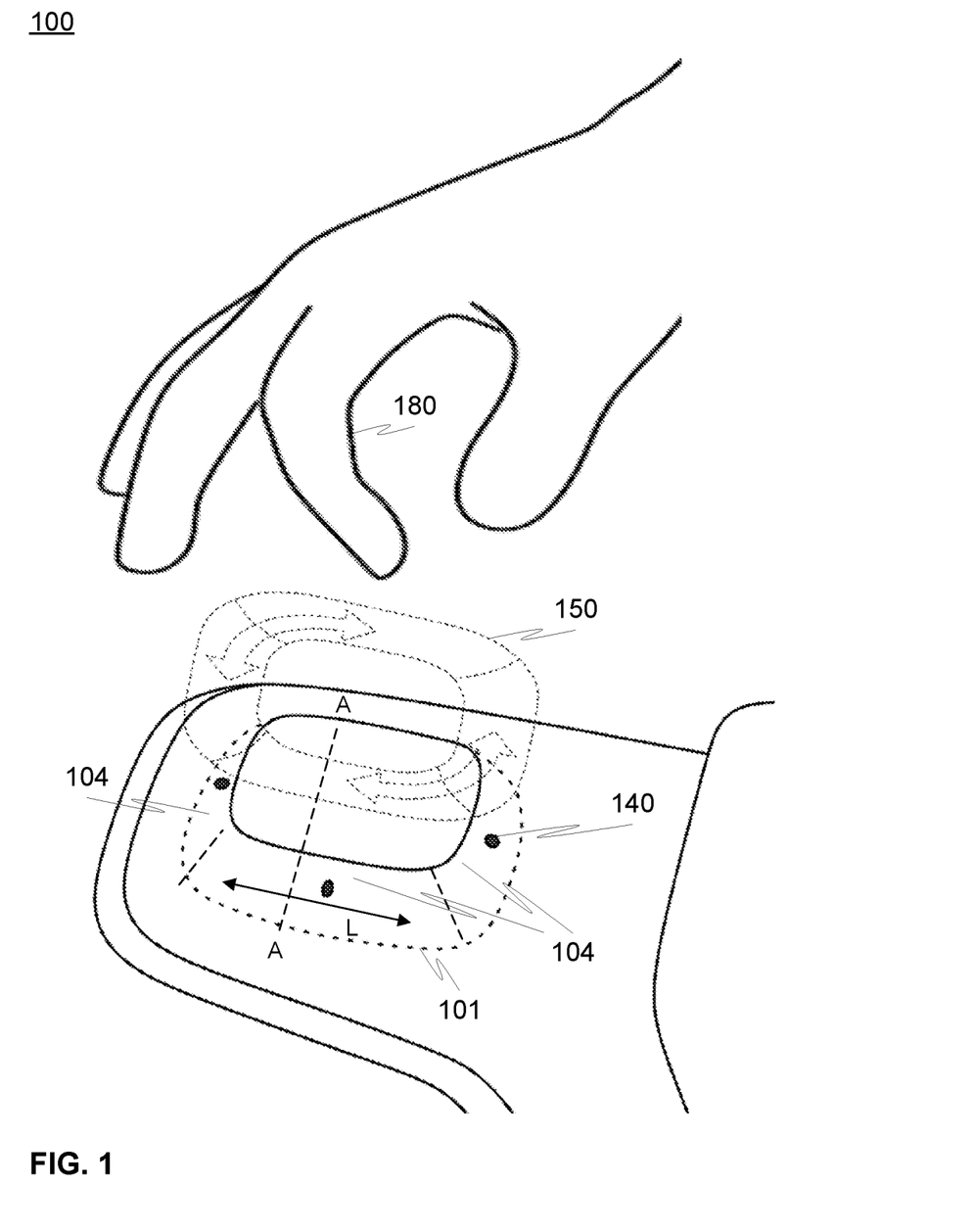
FIG. 1 illustrates an embodiment of a multilayer structure in accordance with the present invention.
Figure 2:
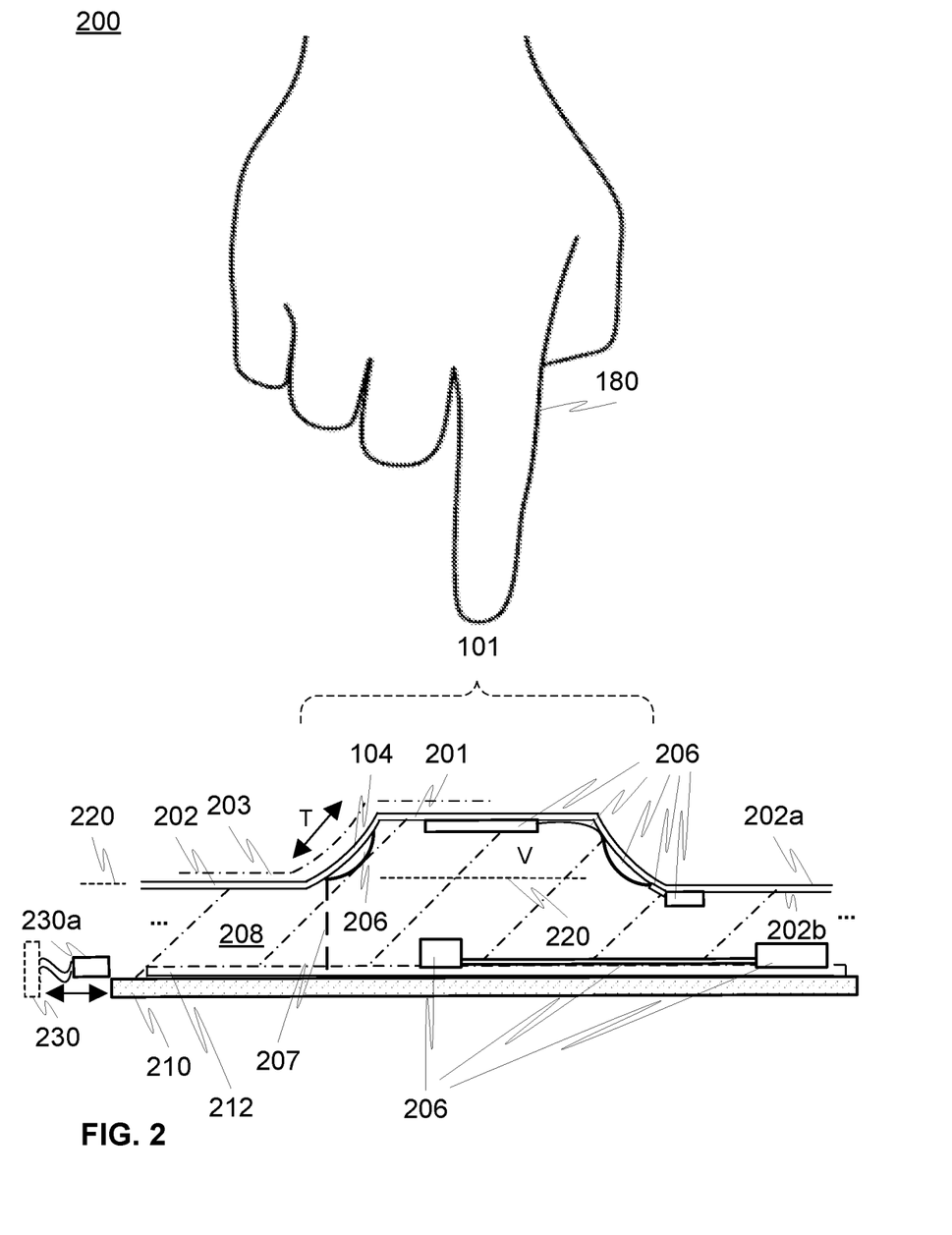
FIG. 2 illustrates a cross-sectional side view of the multilayer structure in accordance with various embodiments of the present invention, such as the embodiment of FIG. 1 along line A-A.

FIG. 1 illustrates, at 100, an embodiment of a multilayer structure in accordance with the present invention. FIG. 2 illustrates, at 200, a cross-sectional side view of the multilayer structure in accordance with various embodiments of the present invention, such as the embodiment of FIG. 1, along line A-A depicted in FIG. 1.

The multilayer structure includes at least one substrate film 202, which is preferably of flexible and 3D-formable (shapeable) such as thermoformable material. In addition to film 202, the structure may include at least one further (substrate) film 212 of material(s) common and/or different from the one(s) of film 202. The film 202 comprises a first side and a related first surface 202a that is advantageously targeted towards the use environment of the structure and e.g., user, or specifically, the user's hand, finger, stylus or other touching, pointing or grabbing element 180 residing therein. Yet, the film 202 comprises an opposite, second side and associated second surface 202b essentially facing the structure internals, for instance.

The substrate film 202 and/or further film 212 or material layer included in the multilayer structure may comprise at least one material selected from the group consisting of: polymer, thermoplastic material, electrically insulating material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

The thickness of the film 202 and optionally of further film 212 may vary depending on the embodiment; it may only be of few tens or hundreds of a millimeter, or considerably thicker, in the magnitude of one or few millimeter(s), for example.

Preferably at least the film 202 and optionally further film 212 has been processed by thermoforming or other feasible (considering the material(s)) shaping method to define a local protrusion 101 rising from a plane 220 defined by surrounding film material. The protrusion 101 may have and define a number of side walls 104 as well as e.g., a top surface 201. It 101 preferably creates a knob shape that is tactilely and advantageously also visually perceivable from the environment of the structure by a user, being easy to feel and also pinch, for instance. The corners or edges between the walls 104 and between the walls 104 and top surface 201 may be rounded, or curved, and be a direct result of the used shaping method such as thermoforming, for example. Alternatively, a recess shape could be created by the protrusion 101 in the multilayer structure, which is illustrated e.g., in FIGS. 11 and 12, and discussed in more detail in the related description.

In various embodiments, at least locally such as on any of the walls 104, top 201 and/or surrounding film there may be one or more additional layers 203. Any additional layer 203 may optionally comprise e.g., a coating or a film. The material of the material layer may be different from the one of the substrate film 202. It may include e.g. a selected polymer material optionally with (nano)particles for providing a desired anti-scratch, anti-reflective, reflective, tactile and/or visual effect among other options.

Item 208 refers to at least one fill layer preferably provided by molding it on the film 202, and optionally between films 202 and 212, wherein the film(s) may be have been used as insert(s) in the concerned mold(s).

The at least one fill layer may comprise at least one material selected from the group consisting of: polymer, organic material, biomaterial, composite material, thermoplastic material, thermosetting material, elastomeric resin, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

Item 206 refers to circuitry provided upon the substrate film 202, i.e., directly (on)to the film 202 itself (typically thus onto at least one selected surface thereof) and/or to any adjacent or subsequent films, or other material layers, of the multilayer structure. The circuitry 206 may include e.g., a number of electrical conductors (traces), contact pads, electrodes, and integrated circuits (IC), such as sensor driving, reading and/or control circuits, or control circuits in general regarding e.g., the UI function provided by the structure and/or some other function provided by the structure.

In line with the foregoing, the circuitry 206 may be directly produced e.g. on any one or more of films 202 (e.g., onto surface 202b) and 212 (if present), and/or to/on other structures, material layers or related surfaces of the multilayer structure, by selected method(s) such as printed electronics technology, optionally screen printing or other additive printing or generally coating technique. Additionally or alternatively, the circuitry 206 may include a number of mounted components such as surface-mounted devices (SMD). Accordingly, non-conductive and/or conductive adhesive may be utilized for securing the mounted components on the carrier. In some embodiments, mechanical securing is implemented or at least enhanced by non-conductive adhesive material whereas solder or other electrically highly conductive (but to lesser extend, adhesive type of) material is used for electrical connection. Preferably, the circuitry 206 is at least partially, if not fully, provided on the film 202 and optionally film 212 prior to 3D-shaping of the film(s) (i.e., when the film(s) 202, 212 were still essentially planar or at least more planar) to avoid tedious 3D-assembly of electronics on already 3D-shaped carriers. However, embodiments wherein the film 202 does not carry any or at least substantial amount of the circuitry 206 are feasible as well. In these and other embodiments, e.g. further substrate film 212 or other material layer may still host any selected circuitry 206.

If e.g. capacitive sensing is applied, sensing electrodes of the circuitry 206 may be configured (dimensioned, positioned, etc.) so that their sensing area or volume defined by e.g. the associated electric field is located as desired and thereby covers e.g. the area upon selected side walls and/or top of the structure, and/or other regions that should be made sensitive to touch (and/or touchless gestures in some embodiments). This type of configuring may be achieved or performed through the utilization of simulation or measurements, for instance.

The circuitry 206 may thus comprise and/or the remaining multilayer structure may comprise at least one component selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, microprocessor, microcontroller, digital signal processor, signal processor, programmable logic chip, ASIC (application-specific integrated circuit), data storage element, electronic sub-assembly, light directing element, lightguide, lens and reflector.

Preferably one or more of the side walls 104 and/or top 201 are associated or provided with circuitry 206 such as electrodes for e.g., capacitive sensing, or other sensing elements that may be connected to control circuit, such as a microcontroller, microprosessor or an integrated IMSE node (component-like integrated IMSE sub-assembly with a substrate, electronics, fill and optional shell of its own), also preferably provided within the structure, e.g. within the volume (V) essentially defined by the protrusion 101 shape or elsewhere in the structure, and/or even outside the structure in a host or external device, for example. Each wall 104, advantageously interior surface 202*b* thereof, may be associated not only with a single but a plurality of sensing elements such as electrodes arranged in a desired configuration such as a row (e.g. lateral) or matrix configuration. Alternatively or additionally, a sensing element may be dimensioned and positioned, and sensing or reading circuitry generally configured by a skilled person so that it covers a selected greater area or region alone and optionally enables more specific sensing of e.g. user's finger on the region with a spatial resolution more precise than just the whole area/region covered.

As already alluded to above, the structure may be and in many preferred use scenarios will be connected to an external system or device 230 such as a host device of the structure, which is illustrated in FIG. 2 by a connector, e.g. electrical connector, or connector cable 230*a* that may be attached to the structure and its elements such as circuitry 206 in a selected fashion, e.g. communications and/or power supply wise.

Item 210 refers to a possible host surface or structure for the multilayer structure contemplated herein. In some embodiments, the item 210 may be a part of the host device of the multilayer structure, or it 210 may be an intermediate element. A skilled person will readily understand that connectors 203*a* or generally connections between the electronics of the multilayer structure and of the host/external device can be achieved through the item 210 instead of or in addition to sides thereof. The material of the item 210 may include any material considered advantageous such as any of the materials listed above (plastic, metal, organic or natural material, for example).

Item 140 refers to one or more possible visual indicators provided in the structure, e.g. on the film 202. These indicators may indicate, to the user, the location of gesture sensitive areas, guidance on how to provide input, feedback responsive to a detected user input, status of the UI or particular feature of the UI, or of the host/connected external device. The indicators may be static such as graphics printed or otherwise produced on a host surface such as the film 202, possible coating 203 or a further layer of the structure. Additionally or alternatively, the indicators may have a temporally dynamic component. For example, by embedded light sources such as (O)LEDs, the structure may be configured to provide dynamic visual information to the user (dimming, on/off control, etc.). For example, if a side wall 104 is provided with a number of light sources e.g., as a part of circuitry 206 or translucent/transparent material letting light from underneath light source to glow through, the light sources may be controlled to indicate a detected or awaited user input to the user by, for instance, turning the light(s) momentarily on e.g. in a selected sequence (e.g. row of light sources/indicators activated one at a time in a spatially continuous sequence indicative of awaited/detected finger swipe).

Item 207 refers to at least one possible connecting element such as electrically conductive pin, rod or wiring, extending between the different sides of the fill layer 207 and e.g. circuitry 206 provided on each of the sides. The connection provided could alternatively or additionally be wireless.

Item 150 is a dot sketch illustrative of user input that could be duly given and detected by the structures in accordance with various embodiments of the present invention. Besides tap and 2D-swipe activities, continuous gestures such as swipes over several surfaces such as side walls 104 could be detected and associated with a predetermined response. As contemplated hereinbefore, as the UI solution suggested herein may establish a portion of a larger ensemble of several structures and/or devices, considering e.g. in-vehicle electronics, UI input detected by or via the multilayer structure, may be indicated or a related response involving e.g., a control action provided using, in addition to or instead of the multilayer structure itself, also other at least functionally connected external devices or the so-called host device.

In various embodiments, a multi-sided knob shape defined by the protrusion 101, or generally the protrusion 101 itself, comprises a top 201, a cross-section and/or 2D projection, at least one of which preferably having substantially a squircular shape.

In the above and other embodiments, the protrusion and the multilayer structure in general may have been configured preferably at least for touch-based gesture detection through the utilization of the circuitry 206 via at least two, preferably each, of the side walls of the plurality of side walls of the protrusion 101 via directly wall-mounted/provided (e.g. additively printed) and/or remotely positioned sensing elements such as electrodes and related additional circuitry 206 of the multilayer structure.

In various embodiments, the multi-sided knob shape or recess shape defined by the protrusion in the multilayer structure may comprise a general shape of a sphube (spherical cube) or a squircular ellipsoid. The general or dominant shape may have been modified with canted and/or curved side walls 104, and/or a planar, angular or curved top 201, for instance.

In various embodiments the multi-sided knob shape defined by the protrusion may comprise e.g., any of 3, 4, 5, 6, 7 or 8 touch-sensitive side walls in the plurality of side walls.

Preferably the knob or recess shape has rounded corners between at least two, preferably each, adjacent side walls 104, and optionally the switchover between side walls 104 and a top 201 is rounded as well. Round(ed) shapes may be preferable, achievable and thus more practical also from the standpoint of used materials and processes, e.g. thermoforming or other 3D-shaping.

In various embodiments, at least one side wall of the plurality of side walls 104, preferably each of them, defines a curved surface, optionally a convex and/or concave surface in lateral L and/or transverse T directions of the side walls.

Figure 3:
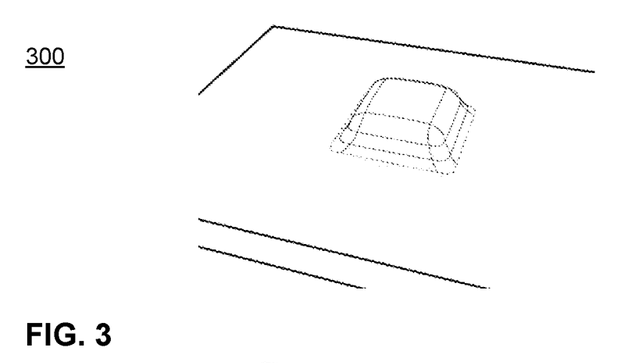
FIG. 3 illustrates an embodiment of the multilayer structure and specifically, associated knob-defining protrusion comprising concave side walls.

In FIG. 3, there is illustrated, at 300, an embodiment of the multilayer structure and specifically, associated knob-defining protrusion comprising concave side walls.

Figure 4:
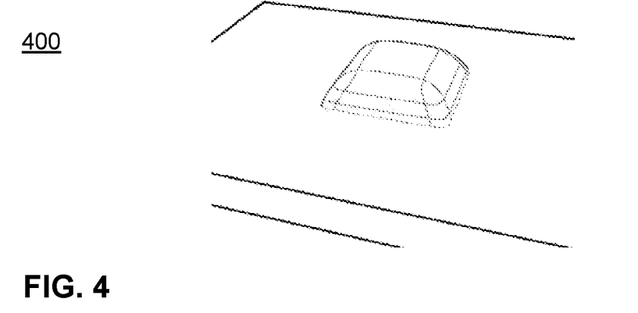
FIG. 4 illustrates an embodiment of the multilayer structure and specifically, associated knob-defining protrusion comprising convex side walls.

In FIG. 4, there is illustrate, at 400, an embodiment of the multilayer structure and specifically, associated knob-defining protrusion comprising convex side walls.

Preferably at least one side wall defines essentially a saddle surface, preferably convex in lateral (L) and concave in transverse (T) directions of the side wall, or vice versa.

Figure 5:
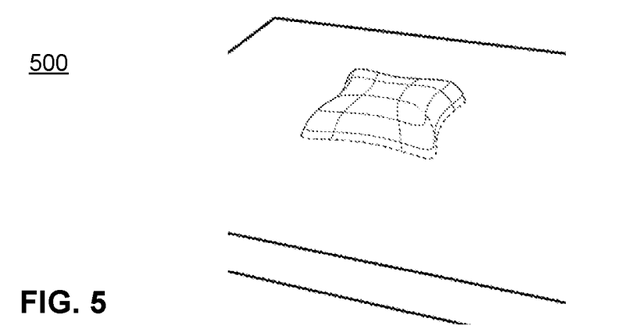
FIG. 5 illustrates an embodiment of the multilayer structure and specifically, associated knob-defining protrusion comprising saddle surface type side walls.

FIG. 5 illustrates, at 500, an embodiment of the multilayer structure and specifically, associated knob-defining protrusion comprising saddle surface type side walls (concave in lateral direction, convex in transverse).

Figure 6:
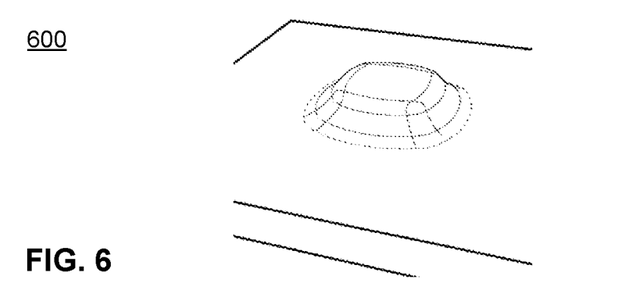
FIG. 6 illustrates one other embodiment of the multilayer structure and specifically, associated knob-defining protrusion comprising saddle surface type side walls.

FIG. 6 illustrates, at 500, one other embodiment of the multilayer structure and specifically, associated knob-defining protrusion comprising saddle surface type side walls (convex in lateral direction, concave in transverse).

In various embodiments, the protrusion 101 may have a substantially flat or curved top 201, optionally of substantially squircular shape, the diameter of which is optionally in the order of magnitude of about 8 centimeters or less, more preferably about 7 centimeters or less, and most preferably between about 4 and about 7 centimeters. In some other embodiments, also other dimensions may be utilized.

Depending on the embodiment the top 201 may be monolithic with any one or more of the side walls 104 as shown e.g. in FIG. 2, or it may have been originally a separate piece of optionally different material and attached or produced upon the protrusion walls-defining sides using e.g. adhesive and/or suitable mechanical fixing elements (screws, bolts/nuts, snap fastening, etc.).

In some embodiments, the top 201 (or a layer 203 thereon) may implement a touch sensitive surface (e.g. a "button" functionality) by underneath capacitive sensing electrode and associated further circuitry 206, for example. In some embodiments, a touchpad or more versatile user input feature may be likewise implemented.

In various embodiments, the height of the protrusion may be, for example, about 4 centimeters or less, preferably between about 1 centimeter and 3 centimeters. In some other embodiments, also other dimensions may be utilized.

In various embodiments, the length of the sidewalls in the plurality of side walls is about 6 centimeters or less, preferably between about 3 and about 6 centimeters, in the lateral direction L, and/or about 4 centimeters or less, preferably between about 1 centimeter and 3 centimeters in the transverse direction T. In some other embodiments, also other dimensions may be utilized.

As understood by a skilled person and already alluded to above, the dimensions may be adjusted for each embodiment based on e.g. predicted use scenario including, for example, certain sized users (kids vs adults, having apparent differences in their finger reach and dimensions) and types of input to be registered via the UI. In some embodiments, the dimensions may be selected (scaled up) so as to support the users wearing different handwear, for instance.

As contemplated hereinbefore, the multilayer structure including the electronics and protrusion-established knob shape may have been configured to detect a number of different gestures, preferably at least one touch type selected from the group consisting of: radial swipe (continuing round a corner), lateral swipe, tap or multiple taps optionally within a selected time period and/or within a selected time period between successive taps, pinch in, pinch out, parallel gesture such as swipe optionally involving at least two fingers, and opposite gesture such as swipe optionally involving at least two fingers.

Detection or mapping logic may have been coded in the circuitry 206 or external electronics at least functionally connected to the circuitry 206 e.g., via connector 230*a*. For example, if several adjacent or otherwise configured touch sensing elements such as capacitive electrodes indicate a touch in a temporal sequence, it may be translated into a detected (continuous) sweep input by the detection logic and an associated, linked control action potentially activating or deactivating a function in the host or connected external device or system may be then triggered as a response. Generally, association between a certain type of touch (e.g. lateral sweep, tap, sequence of different actions, etc.) and control action may be context-sensitive in a variety of ways. The association may have been configured as application or application view-specific, for instance, and/or it may depend on a number of further conditions such as sensor or other measurable or settable values (acceleration, speed or velocity, temperature, pressure, illumination, orientation, time, location, etc.). Yet, feedback relative to the detected input and optionally indicative of the recognized input type may be provided via the multilayer structure itself, using e.g. visual feedback such as lighting and/or tactile feedback if e.g., a vibration motor or other vibration element has been provided in the multilayer structure as a part of the circuitry 206, for example.

As mentioned hereinearlier, the multilayer structure may comprise a number of light sources, such as LEDs. These light sources may have been configured to have a illumination function based on e.g. decorative or informative (indicative) motive; the light sources may be configured to illuminate e.g., the environment of the structure and/or a surface or other element of the structure itself, such as (a portion of a) side wall 104 or top 201, which is considered ready or unready to receive input, for example. Also decorative shapes or graphics arranged in the structure (paint, ink, surface reliefs, masks, pattern(s) of masking and translucent/transparent material, etc.) may be illuminated. In addition or alternatively, the light source(s) may be configured to indicate the detected touch and optionally also the location and/or nature of the detected touch, further optionally through the multi-sided 3D knob or recess shape defined by the protrusion.

In various embodiments, the control actions contemplated herein may comprise at least one action selected from the group consisting of: triggering of a control signal, light control, light control in the multilayer structure, external light control, vehicle feature control, host device feature control, aircon control, chassis control, multimedia control, window control, menu feature access, cursor motion, feature selection, feature activation, menu feature selection, scroll action, menu items scroll action, and zoom.

In some embodiments, the multilayer structure may be configured to detect at least partially contactless 2D or 3D gesture preferably upon the multi-sided knob or recess shape, and further preferably to detect the type of the gesture. For example, capacitive sensing may be utilized also for this purpose.

As implied also hereinbefore, in various embodiments different material(s) of the substrate film 202, and/or any of further layer(s) or elements, such as the fill 208, the layer 203, or the further film 212 may at least partially be optically substantially opaque or at least translucent, if not essentially transparent, having regard to predefined wavelengths e.g. in visible spectrum. The concerned element(s), optionally defining at least a portion of the exterior (surface) of the multilayer structure, or being at least visible or otherwise perceivable therethrough, may have been provided with a number of visually distinguishable, decorative/aesthetic and/or informative, features such as graphical pattern and/or color thereon or therein. The used materials may be at least partially, i.e. at least in places, optically substantially transparent to radiation such as visible light emitted by the electronics thereon. The transmittance may be about 80%, 85%, 90%, 95% or higher, for example.

In various embodiments, selected features including also e.g. graphics, coloring or other visual features may have been provided on any of the internal surfaces or layers of the multilayer structure. Accordingly, different impacts, rubbing, chemicals, etc. that could easily damage e.g. painted, printed or mounted surface features do not affect or reach the embedded/non-surface and potentially hermetically sealed features.

Figure 7:
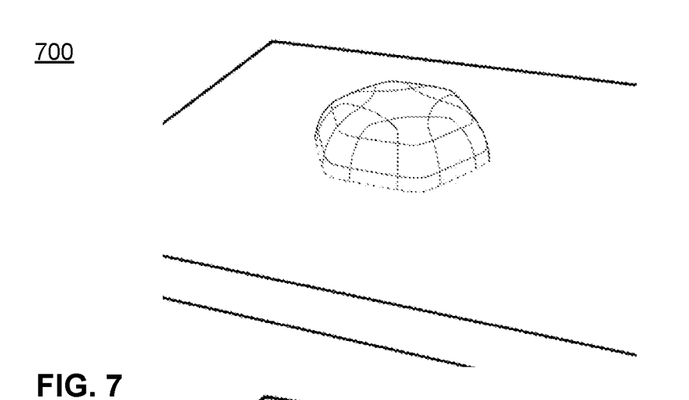
FIG. 7 illustrates an embodiment of the multilayer structure and specifically, associated knob-defining protrusion having a regular shape and defining six side walls.

FIG. 7 illustrates, at 700, an embodiment of the multilayer structure and specifically, associated knob-defining protrusion having a regular, highly symmetrical shape and defining six side walls. In other feasible embodiments the number of side walls may be different but the structure still remains regular.

Figure 8:
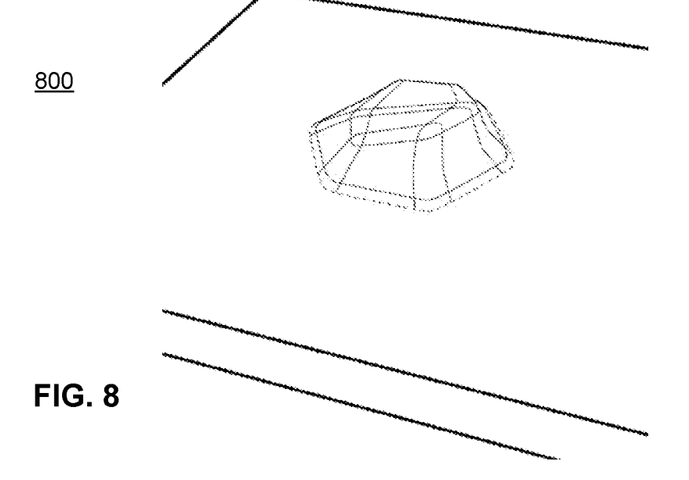
FIG. 8 illustrates an embodiment of the multilayer structure and specifically, associated knob-defining protrusion having an irregular shape and defining five side walls.

FIG. 8 illustrates, at 800, an embodiment of the multilayer structure and specifically, associated knob-defining protrusion having a more irregular shape and defining five side walls. In other feasible embodiments, the number of side walls could naturally be different while the shape remains still generally irregular.

Figure 9:
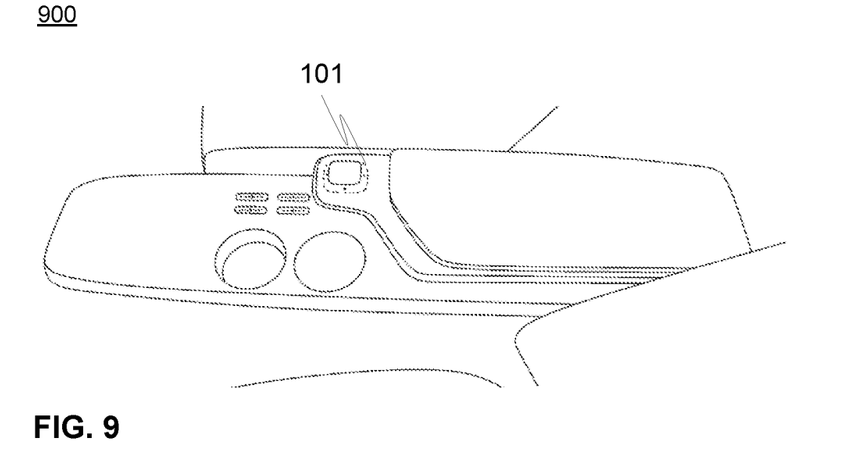
FIG. 9 illustrates an embodiment of a host device, such as an armrest, comprising an embodiment of the multilayer structure.

FIG. 9 illustrates, at 900, an embodiment of a host device, such as an armrest, comprising an embodiment of the multilayer structure, such as the embodiment of FIGS. 1 and 2.

Figure 10:
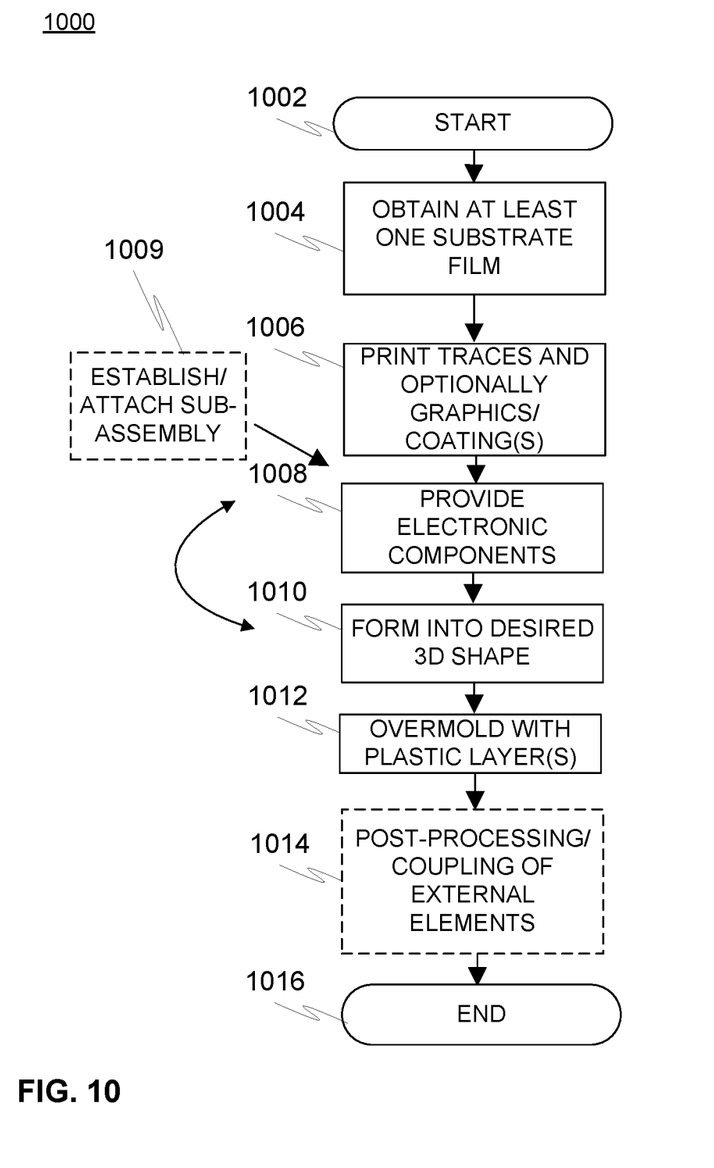
FIG. 10 is a flow diagram of an embodiment of a method in accordance with the present invention.

FIG. 10 includes, at 1000, a flow diagram of an embodiment of a method in accordance with the present invention.

At the beginning of the method for manufacturing the multilayer structure, a start-up phase 1002 may be executed. During start-up, the necessary tasks such as material, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding, IMD (in-mold decoration), lamination, bonding, (thermo)forming, electronics assembly, cutting, drilling and/or printing equipment, among others, may be thus ramped up to operational status at this stage.

At 1004, at least one, optionally flexible, substrate film of plastics or other material for accommodating e.g., electronics is obtained. The substrate film may initially be substantially planar or e.g. curved. The substrate film may at least dominantly be of electrically substantially insulating material(s). A ready-made element, e.g. a roll or sheet of plastic film, may be acquired for use as the substrate material. In some embodiments the substrate film itself may be first produced in-house by molding using a mold and/or a molding device or other methods from selected starting material(s). Optionally, the substrate film may be processed further at this stage. It may be, for example, provided with holes, notches, recesses, cuts, etc.

At 1006, a number of conductive elements defining e.g. conductor lines (traces), sensing elements such as electrodes, and/or contact areas to construct a circuit design are provided on any one or more of the included substrate film(s), either or both sides thereof, preferably by one or more additive techniques of printed electronics technology. For example, screen, inkjet, flexographic, gravure or offset lithographic printing may be applied by suitable printing device or devices. In some cases, also subtractive or semi-additive processes may be utilized. Further actions cultivating the film(s) involving e.g. printing or generally provision of graphics, visual indicators, optical elements, etc. thereon may take place here.

In various embodiments the electrically conductive elements may include at least one material selected from the group consisting of: conductive ink, conductive nanoparticle ink, copper, steel, iron, tin, aluminium, silver, gold, platinum, conductive adhesive, car-bon fibre, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

At 1008 one or more typically ready-made components including electronic components such as various SMDs may be attached to the contact areas on the film(s) e.g. by solder and/or adhesives. A suitable pick-and-place or other mounting device may be utilized for the purpose, for instance. Alternatively or additionally, printed electronics technology may be applied to actually manufacture at least part of the components, such as OLEDs, directly onto any one or more of the included film(s). Accordingly, the execution of items 1006, 1008 to provide the multilayer structure with desired circuitry may temporally overlap as being understood by a skilled person. Yet, the components installed may include e.g. one or more connectors.

For the sake of completeness having regard to the provision of circuitry and components to the structure, item 1009 refers to possible attachment of one or more sub-systems or 'sub-assemblies' that may incorporate an initially separate, secondary substrate provided with electronics such as IC(s) and/or various components. At least part of the electronics of the multilayer structure may be provided to the substrate film(s) via such sub-assembly. Optionally, the sub-assembly may be at least partially overmolded by a protective plastic layer prior to attachment to the main substrate. This may be the case with e.g. component-like IMSE nodes mentioned hereinbefore. For example, adhesive, pressure and/or heat may be used for mechanical bonding of the sub-assembly with the primary (host) substrate. Solder, wiring and conductive ink are examples of applicable options for providing the electrical connections between the elements of the sub-assembly and with the remaining electrical elements on the primary substrate. Item 1009 could also be executed e.g. upon item 1006 or 10110. The shown position thereof is primarily exemplary only.

In some embodiments, prior to or upon the molding phase 1012, the substrate film(s) preferably already containing e.g. at least part of the circuit design, such as (printed) conductive elements and optionally electronic components, and/or of the connector (see the bi-directional curved arrow highlighting the fact that forming could alternatively or additionally take place e.g. between items 1006 and 1008, or even prior to item 1006) may be formed 1010 using thermoforming or cold forming, for instance, to exhibit a desired shape such as at least locally a three-dimensional (essentially non-planar) shape including the knob or recess-defining protrusion discussed in more detail hereinelsewhere. Applicable former device such as a thermoformer may be naturally utilized for the purpose. Additionally or alternatively, at least some forming could take place after molding in case the already-established multilayer stack is designed to survive such processing.

At 1012, at least one plastic fill layer, preferably thermoplastic or thermoset layer, is produced, preferably molded such as injection molded, upon the substrate(s) so as to preferably at least partially fill the volume defined by the protrusion shape (more applicable to the knob embodiment) and at least partially embed the circuitry and optionally further components or elements of the multilayer structure (applicable to both knob and recess embodiments). The molded material(s) may be provided using several molding steps or shots, or via a single step, wherein molded material may even optionally flow through a film from one side thereof to the opposing side via a hole prepared therein or by penetrating through the substrate material itself (e.g. through a thinned/thinner portion), for example. The molding material(s) may be e.g., electrically substantially insulating.

In practice, at least one substrate film already provided with a number of further features such as the circuitry may be used as an insert in an injection molding process applying at least one molding machine. In case two films are used, both of them may be inserted in their own mold halves so that the plastic layer is injected at least between them. Alternatively, the second film could be attached to an aggregate of the first film and plastic layer afterwards by suitable lamination technique.

Regarding the resulting overall thickness of the obtained stacked multilayer structure (excluding the protrusion the dimensions of which have been discussed hereinelsewhere), it depends e.g. on the used materials and related minimum material thicknesses providing the necessary strength in view of the manufacturing and subsequent use. These aspects have to be considered on case-by-case basis. For example, the overall thickness of the structure could be in the order of magnitude of about some millimetres, but considerably thicker or thinner embodiments are also feasible.

Item 1014 refers to possible additional tasks such as post-processing tasks. Further layers or generally features, may be added into the multilayer structure by molding, lamination or suitable coating (e.g. deposition) procedure. The layers may be of protective, indicative and/or aesthetic value (graphics, colors, figures, text, numeric data, etc.) and contain e.g. textile, leather or rubber materials instead of or in addition to further plastics. Additional elements such as electronics may be installed at the outer surface(s) of the structure, such as the exterior surface of the substrate or a molded layer thereon depending on the embodiment. Shaping/cutting may take place. If provided with a connector, the connector may be connected to a desired external connecting element such as an external connector of an external device, system or structure, e.g. a host device. For example, these two connectors may together form a plug-and-socket type connection and interface.

At 1016, method execution is ended.

Figure 11:
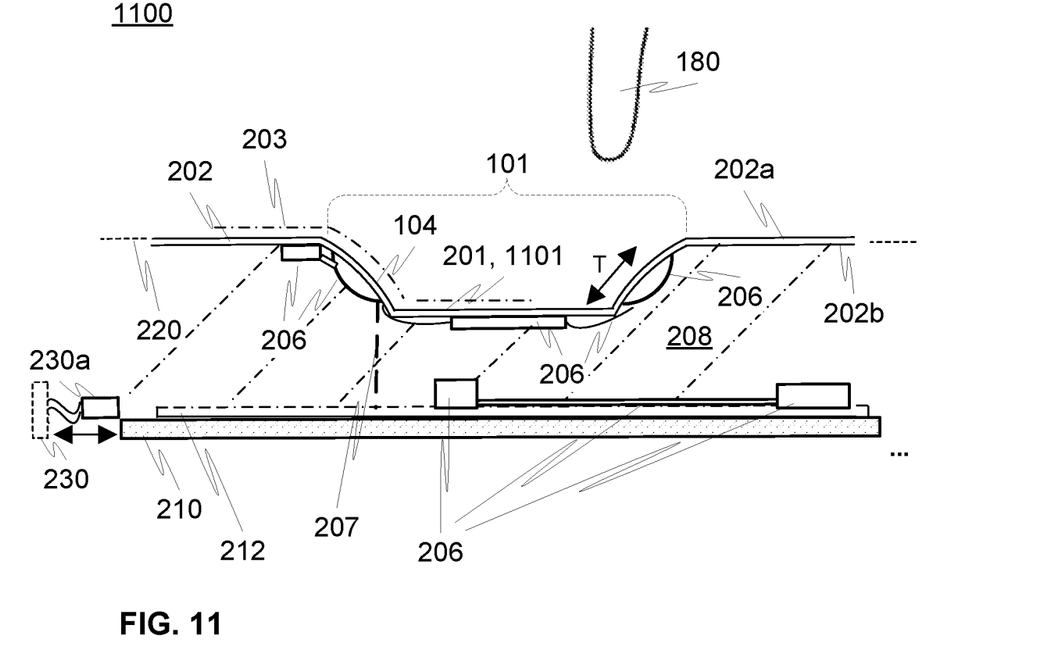
FIG. 11 illustrates a further embodiment of the multilayer structure in accordance with the present invention and specifically, associated recess-defining protrusion via a cross-sectional side view.

In the embodiment 1100 depicted in FIG. 11, the protrusion 101 established in the film 202 has been basically flipped 180 deg from the ones of the previously elaborated embodiments and thus configured to protrude away from the environment of the multilayer structure and a user (fingers, stylus, etc.) therein, and thus towards the internals of the multilayer structure unlike in the previous embodiments where the protrusion was essentially directed towards the environment and protruded away from the surrounding remaining substrate film and the overall multilayer structure. Here the protrusion 101 of the film 202 therefore defines a recess in the multilayer structure, still with vertical or canted side walls, instead of an outward-protruding knob shape. Even if there were further layers 203 such as film(s), coating(s) and/or fills on top of the formed recess, the recess would preferably still remain accessible and present on the outer surface of the overall structure. The top 201 of the protrusion established in the film 201 may thus simultaneously define the bottom 1101 of the recess defined by the protrusion 101 in relation to the overall multilayer structure. The dimensions may be selected so that the user's finger(s) or stylus 180 get sufficient clearance to enter the recess for providing user input by touching the walls 104 or the bottom 1101 using taps and/or swipes, for instance.

In this and similar embodiments, the volume defined, or limited, by the plane of the surrounding substrate film portion and the actual protrusion shape 101, and thus defining the aforesaid recess for the user to enter and interact with using their finger(s) and typically dominantly fingertips, or a stylus, for example, does not necessarily (while being still possible though) accommodate additional elements such as electronics 206, which can be configured in many scenarios quite conveniently on the second side 202b of the film 202 as shown in the figure, e.g. essentially adjacent (e.g. on the side and/or below) the recess shape, and/or farther away therefrom. Accordingly, the side walls and recess bottom facing and limiting the volume on the first side 202a of the film 201 may be kept free from further elements when desired. In many real-life use scenarios the volume defined by the recess is commonly accommodated by fluid such as air of the use environment, occasionally then replaced by the finger(s) or stylus of the user.

Generally, various considerations and remarks provided hereinbefore regarding the previously discussed embodiments and their features (materials, dimensions, shapes including protrusion shapes and side wall shapes, additional elements, functionalities, etc.), as well as different general principles of the present invention are still applicable in connection with the embodiment of FIG. 11 mutatis mutandis as being appreciated by a person skilled in the art.

In some embodiments, even a combination of outward- (knob) and inward-protruding (recess) shapes could be provided in the multilayer structure and optionally the same substrate film. For example, a larger recess shape may even integrate a smaller knob shape, or a larger knob shape may include a smaller recess shape, or the shapes may be adjacently positioned.

Figure 12:
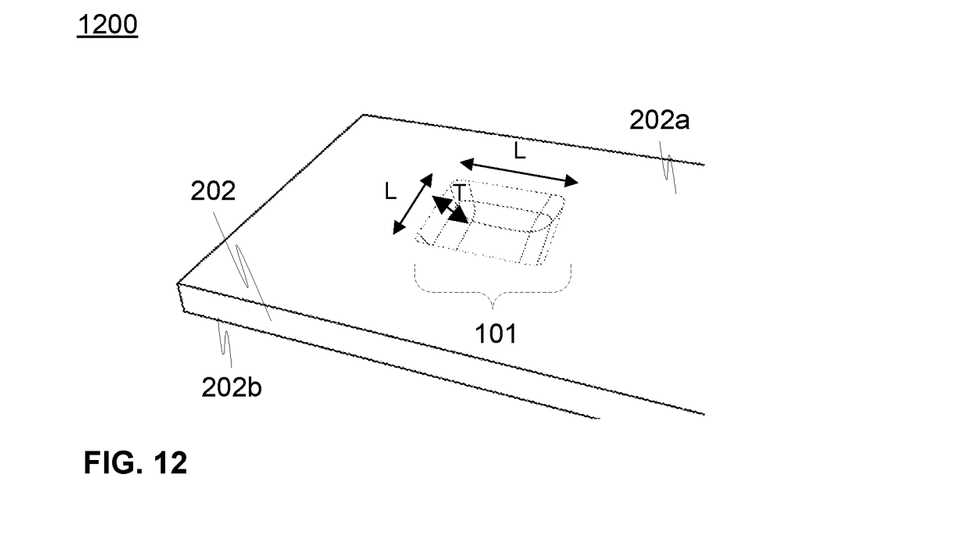
FIG. 12 illustrates an embodiment of the substrate film of FIG. 11 via a related axonometric sketch.

FIG. 12 illustrates, at 1200, an embodiment of the substrate film of FIG. 11 via a related axonometric sketch. The established recess may be of different shapes as was the case with corresponding knob shapes contemplated hereinbefore.

For instance, otherwise substantially similar but flipped shapes may be utilized. The illustrated case herein works only as one feasible example.

Figure 13:
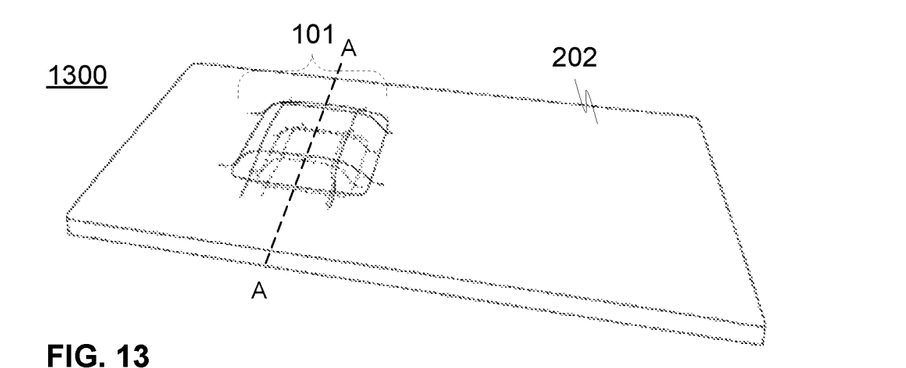
FIG. 13 illustrates an embodiment of the multilayer structure from the standpoint of a potential overall shape thereof especially in the region of a protrusion of the substrate film projecting outward, i.e. towards the user and establishing a knob, from the surrounding remaining structure, wherein further material layers of the structure at least locally generally follow the shape of the protrusion.
Figure 14:
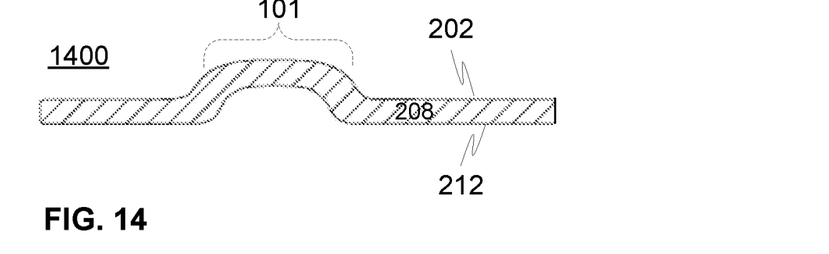
FIG. 14 is a sketch of a cross-sectional side view of the embodiment of FIG. 13 along line A-A.

FIG. 13 illustrates, at 1300, an embodiment of the multilayer structure from the standpoint of a potential overall shape thereof especially in the region of a protrusion 101 of the substrate film 202. FIG. 14 shows, at 1400, a sketch of a cross-sectional side view of the embodiment of FIG. 13 along line A-A.

In the shown embodiment, the protrusion 101 is projecting and extending outward from the surrounding remaining structure, i.e. towards the user in the use environment and thereby establishing a knob shape therein as discussed hereinbefore with reference to various other embodiments, whereas here a number of further material layers of the structure are configured to generally follow the shape of the protrusion as well. One can thus identify a similar knob shape generated by the fill 208 and optionally by further layers such as film 212 (if any) in the structure. The overall thickness of the actual material layers of the structure may be thereby conveniently configured to remain substantially constant even at the location(s) of the protrusion(s) 101, as illustrated.

Figure 15:
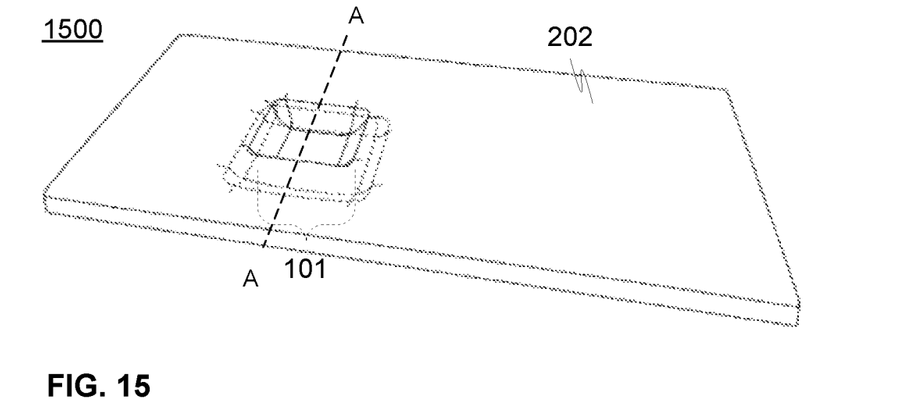
FIG. 15 illustrates an embodiment of the multilayer structure from the standpoint of a potential overall shape thereof especially in the region of a recess-defining protrusion of the substrate film projecting inward and away from the user and use environment of the structure, wherein further material layers of the structure at least locally generally follow the shape of the protrusion.
Figure 16:
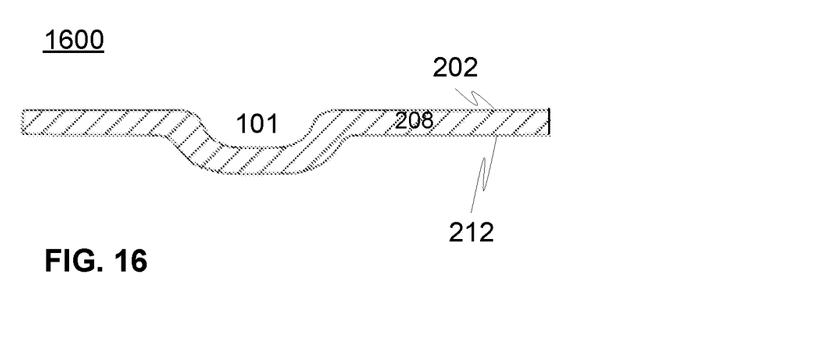
FIG. 16 illustrates the embodiment of FIG. 15 via a cross-sectional side view along line A-A.

FIG. 15 illustrates, at 1500, an embodiment of the multilayer structure from the standpoint of a potential overall shape thereof especially in the region of a recess-defining protrusion 101 of the substrate film 202, thus projecting inward and away from the user and use environment of the structure, wherein further material layers of the structure again generally follow the shape of the protrusion. FIG. 16 illustrates, at 1600, the embodiment of FIG. 15 via a cross-sectional side view along line A-A.

Accordingly, in the embodiments of the FIGS. 13-14 and 15-16 the overall multilayer structure is, what comes to one or more adjacent and subsequent material layers, configured to generally follow the essentially undulating shape of the substrate film 202 at the location of a knob or recess type protrusion 101 established therefrom. Practically constant overall thickness of the structure, as jointly established by the included material layers, could be attained as a result, if desired. Still in terms of the overall multilayer structure, a protrusion on one side of the overall structure can be set to be accompanied by a recess on the opposite side.

This approach differs from the previously discussed embodiments of FIGS. 2 and 11, for instance, wherein one or more further layers of the multilayer structure (e.g. fill 208 or film 212) did not at least generally (on both sides) follow the shape of the substrate 202 at the position of the protrusion 101. Instead, the layers were essentially configured as having substantially planar surfaces (see e.g. bottom surfaces of layers 208, 210, 212 in the concerned FIGS. 2 and 11) at least opposite to the ones facing the protrusion 101, even though also other, potentially more complex, non-planar layer and surface shapes are equally feasible as being understood by a person skilled in the art.

Otherwise, what has been stated hereinbefore having regard to other embodiments including the ones illustrated in FIGS. 1-12, is applicable also in relation to the embodiments of FIGS. 13-16 as being easily comprehended by the skilled person.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario.

The invention claimed is:

1. An integrated functional multilayer structure for building a gestural UI (user interface), comprising:
    a flexible, 3D-formable substrate film comprising a first surface for facing towards an environment of the multilayer structure and a user therein, and an opposite second surface facing towards the internals of the multilayer structure, wherein the first and second surfaces and remaining material of the substrate film in between locally define a three-dimensional protrusion extending from a plane of surrounding substrate film material and formed from locally stretched and shaped material of the substrate film, said protrusion including a plurality of substantially vertical or canted side walls perceptible by touch;
    circuitry provided upon the substrate film, said circuitry comprising a number of conductive traces, electrodes and/or components configured to detect touch on two or more of the plurality of side walls; and
    at least one fill layer arranged upon the substrate film to at least partially embed the circuitry, wherein the at least one fill layer includes at least one injection molded fill layer that is positioned to at least partially fill a volume (V) defined by a shape of the protrusion and the plane.

2. The structure of claim 1, wherein the protrusion comprises a top, a cross-section and/or 2D projection having substantially a squircular shape.

3. The structure of claim 1, wherein the circuitry is at least partially accommodated by a volume (V) defined by the protrusion shape and the plane.

4. The structure of claim 1, wherein the protrusion defines a multi-sided knob extending outward from the surrounding multilayer structure.

5. The structure of claim 1, wherein the protrusion defines a multi-sided recess in the multilayer structure.

6. The structure of claim 1, wherein the protrusion comprises a general shape of a sphube (spherical cube) or a squircular ellipsoid.

7. The structure of claim 1, wherein the protrusion comprises 3, 4, 5, 6, 7 or 8 touch-sensitive side walls in the plurality of side walls.

8. The structure of claim 1, wherein at least one side wall of the plurality of side walls defines a curved surface.

9. The structure of claim 8, wherein said at least one side wall defines essentially a saddle surface.

10. The structure of claim 1, wherein the protrusion has a substantially flat or curved top.

11. The structure of claim 1, wherein the height of the protrusion is about 4 centimeters or less.

12. The structure of claim 1, wherein the length of the sidewalls in the plurality of side walls is about 6 centimeters or less, in the lateral direction (L), and/or about 4 centimeters or less in the transverse direction (T).

13. The structure of claim 1, comprising at least one material layer, upon the first surface of the substrate film.

14. The structure of claim 1, comprising a further film on a side of the fill layer that is opposite to the side of the substrate film.

15. The structure of claim 1, wherein the substrate film and/or further film or material layer included comprises at least one material selected from the group consisting of: polymer, thermoplastic material, electrically insulating material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

16. The structure of claim 1, wherein the at least one fill layer comprises at least one material selected from the group consisting of: polymer, organic material, biomaterial, composite material, thermoplastic material, thermosetting material, elastomeric resin, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

17. The structure of claim 1, wherein the circuitry comprises or the remaining structure comprises at least one component selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, microprocessor, microcontroller, digital signal processor, signal processor, programmable logic chip, ASIC (application-specific integrated circuit), data storage element, electronic sub-assembly, light directing element, lightguide, lens and reflector.

18. The structure of claim 1, configured to detect at least one touch type selected from the group consisting of: radial swipe, lateral swipe, tap, multiple taps, pinch in, pinch out, parallel gesture, and opposite.

19. The structure of claim 1, configured to execute a selected control action in response to the detected touch, said control action being associated, through mapping logic or data, with a recognized type of the touch.

20. The structure of claim 19, wherein the control action comprises at least one action selected from the group consisting of: triggering of a control signal, light control, vehicle feature control, host device feature control, aircon control, chassis control, multimedia control, home appliance control, window control, menu feature access, cursor motion, feature selection, feature activation, menu feature selection, scroll action, menu items scroll action, and zoom.

21. The structure of claim 1, further comprising a number of light sources.

22. The structure of claim 1, configured to detect at least partially contactless 2D or 3D gesture.

23. A host device comprising the structure of claim 1, further comprising at least one of a console, vehicle console, door, roof panel, multimedia device, home appliance, personal communications device, or a control device.

24. The host device of claim 23, further comprising an arm rest provided with at least one of an arm or wrist sensor, and configured to change the operational state of the structure based on data provided by the at least one arm or wrist sensor.

25. A method of using the multilayer structure or host device according to claim 1, comprising the steps of obtaining user input and initiating a control action based on the user input.

26. A method of manufacturing an integrated multilayer structure, comprising:
  obtaining a substrate film comprising formable material and further comprising a first surface for facing towards an environment of the structure and a user therein, and an opposite second surface for facing towards the internals of the structure;
  providing circuitry upon the substrate film;
  3D-forming the substrate film so that the first and second surfaces and remaining material of the formed substrate film in between locally define a three-dimensional (3D) protrusion extending from a plane of surrounding substrate film material, said protrusion comprising a plurality of substantially vertical or canted side walls perceptible by touch,
  wherein said circuitry comprises a number of conductive traces, electrodes and/or components configured upon the substrate film so as to detect touch on two or more of the plurality of side walls; and
  arranging at least one fill layer upon the substrate film to at least partially embed the circuitry, the at least one fill layer including at least one injection molded fill layer that is positioned to at least partially fill a volume (V) defined by a shape of the protrusion and the plane.

27. The method of claim 26, wherein the protrusion comprises a top, a cross-section and/or 2D projection having substantially a squircular shape.

28. The method of claim 26, wherein the protrusion defines a multi-sided knob extending outward from the surrounding multilayer structure.

29. The method of claim 26, wherein the protrusion defines a multi-sided recess in the multilayer structure.

* * * * *